(12) United States Patent
Sreenivasan et al.

(10) Patent No.: US 7,241,395 B2
(45) Date of Patent: Jul. 10, 2007

(54) REVERSE TONE PATTERNING ON SURFACES HAVING PLANARITY PERTURBATIONS

(75) Inventors: Sidlgata V. Sreenivasan, Austin, TX (US); Nicholas A. Stacey, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 493 days.

(21) Appl. No.: 10/946,577

(22) Filed: Sep. 21, 2004

(65) Prior Publication Data

US 2006/0060557 A1  Mar. 23, 2006

(51) Int. Cl.
C03C 25/68 (2006.01)
B44C 1/22 (2006.01)
(52) U.S. Cl. .......................................... 216/54; 216/52
(58) Field of Classification Search ................. 216/44, 216/52, 54
See application file for complete search history.

(56) References Cited

U.S. PATENT DOCUMENTS

| | | |
|---|---|---|
| 4,426,247 A | 1/1984 | Tamamura et al. |
| 4,507,331 A | 3/1985 | Hiraoka |
| 4,512,848 A | 4/1985 | Deckman et al. |
| 4,657,845 A | 4/1987 | Frchet et al. |
| 4,692,205 A | 9/1987 | Sachdev et al. |
| 4,731,155 A | 3/1988 | Napoli et al. |
| 4,931,351 A | 6/1990 | McColgin et al. |
| 4,959,252 A | 9/1990 | Bonnebat et al. |
| 4,976,818 A | 12/1990 | Hashimoto et al. |
| 5,028,366 A | 7/1991 | Harakal et al. |
| 5,071,694 A | 12/1991 | Uekita et al. |
| 5,173,393 A | 12/1992 | Sezi et al. |
| 5,198,326 A | 3/1993 | Hashimoto et al. |
| 5,234,793 A | 8/1993 | Sebald et al. |
| 5,240,550 A | 8/1993 | Boehnke et al. |
| 5,314,772 A | 5/1994 | Kozicki et al. |
| 5,425,848 A | 6/1995 | Haisma et al. |

(Continued)

FOREIGN PATENT DOCUMENTS

JP    02-24848    1/1990

(Continued)

OTHER PUBLICATIONS

U.S. Appl. No. 10/843,194, filed May 11, 2004, Sreenivasan et al.

(Continued)

*Primary Examiner*—Parviz Hassanzadeh
*Assistant Examiner*—Roberts Culbert
(74) *Attorney, Agent, or Firm*—Kenneth C. Brooks

(57) ABSTRACT

The present invention features a method of patterning a substrate that includes forming, on the substrate, a first film having an original pattern that includes a plurality of projections a subset of which extends from a nadir surface terminating in an apex surface defining a height therebetween. A second film is disposed upon the first film and defines a surface spaced-apart from the apex surface of the plurality of projections. A variation in a distance between the apex surface of any one of the plurality of projections and the surface being within a predetermined range. A recorded pattern is transferred onto the substrate that corresponds to the original pattern, within the predetermined range being selected to minimize pattern distortions in the recorded pattern.

35 Claims, 8 Drawing Sheets

U.S. PATENT DOCUMENTS

| | | |
|---|---|---|
| 5,434,107 A | 7/1995 | Paranjpe |
| 5,480,047 A | 1/1996 | Tanigawa et al. |
| 5,545,367 A | 8/1996 | Bae et al. |
| 5,601,641 A | 2/1997 | Stephens |
| 5,700,626 A | 12/1997 | Lee et al. |
| 5,743,998 A | 4/1998 | Park |
| 5,772,905 A | 6/1998 | Chou |
| 5,849,209 A | 12/1998 | Kindt-Larsen et al. |
| 5,849,222 A | 12/1998 | Jen et al. |
| 5,888,650 A | 3/1999 | Calhoun et al. |
| 5,907,782 A | 5/1999 | Wu |
| 6,033,977 A | 3/2000 | Gutsche et al. |
| 6,046,056 A | 4/2000 | Parce et al. |
| 6,074,827 A | 6/2000 | Nelson et al. |
| 6,096,655 A | 8/2000 | Lee et al. |
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. |
| 6,391,217 B2 | 5/2002 | Schaffer et al. |
| 6,426,288 B1 | 7/2002 | Meikle |
| 6,455,411 B1 | 9/2002 | Jiang et al. |
| 6,482,742 B1 | 11/2002 | Chou |
| 6,517,995 B1 | 2/2003 | Jacobenson et al. |
| 6,518,189 B1 | 2/2003 | Chou |
| 6,580,172 B2 | 6/2003 | Mancini et al. |
| 6,646,662 B1 | 11/2003 | Nebashi et al. |
| 6,696,220 B2 | 2/2004 | Bailey et al. |
| 6,703,190 B2 | 3/2004 | Elian et al. |
| 6,713,238 B1 | 3/2004 | Chou et al. |
| 6,716,767 B2 | 4/2004 | Shih et al. |
| 6,719,915 B2 | 4/2004 | Willson et al. |
| 6,730,256 B1 | 5/2004 | Bloomstein et al. |
| 6,737,202 B2 | 5/2004 | Gehoski et al. |
| 6,743,713 B2 | 6/2004 | Mukher-Hee-Roy et al. |
| 6,767,983 B1 | 7/2004 | Fujiyama et al. |
| 6,770,852 B1 | 8/2004 | Stegner |
| 6,776,094 B1 | 8/2004 | Whitesides et al. |
| 6,777,170 B1 | 8/2004 | Bloomstein et al. |
| 6,809,356 B2 | 10/2004 | Chou |
| 6,814,879 B2 | 11/2004 | Shibata |
| 6,828,244 B2 | 12/2004 | Chou |
| 2002/0042027 A1 | 4/2002 | Chou et al. |
| 2002/0132482 A1 | 9/2002 | Chou |
| 2002/0167117 A1 | 11/2002 | Chou |
| 2002/0177319 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0029041 A1 | 2/2004 | Shih et al. |
| 2004/0036201 A1 | 2/2004 | Chou et al. |
| 2004/0046288 A1 | 3/2004 | Chou |
| 2004/0110856 A1 | 6/2004 | Young et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0188381 A1 | 9/2004 | Sreenivasan |
| 2004/0192041 A1 | 9/2004 | Jeong et al. |
| 2004/0197843 A1 | 10/2004 | Chou et al. |
| 2004/0211754 A1 | 10/2004 | Sreenivasan |

FOREIGN PATENT DOCUMENTS

| | | |
|---|---|---|
| JP | 02-92603 | 4/1990 |
| WO | WO 99/05724 | 2/1999 |
| WO | WO 00/21689 | 4/2000 |
| WO | WO 01/47003 | 6/2001 |
| WO | WO 02/07199 | 1/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |

OTHER PUBLICATIONS

U.S. Appl. No. 10/946,159, filed Sep. 21, 2004, Miller et al.

U.S. Appl. No. 10/946,565, filed Sep. 21, 2004, Vidusek et al.

U.S. Appl. No. 10/946,566, filed Sep. 21, 2004, Sreenivasan et al.

U.S. Appl. No. 10/946,570, filed Sep. 21, 2004, Sreenivasan.

U.S. Appl. No. 10/946,574, filed Sep. 21, 2004, Choi et al.

Chou, Nanoimprint Lithography and Lithographically Induced Self-Assembly, MRS Bulletin, pp. 512-517, Jul. 1, 2001.

Choi et al., Design of Orientation Stages for Step and Flash Imprint Lithography, Precision Engineering, pp. 192-199, Jan. 1, 2001.

Colburn et al., Step and Flash Imprint Lithography for sub-100 nm Patterning, Proceedings of SPIE vol. 3997, pp. 453-457, Jan. 1, 2000.

Chou et al., Imprint Lithography with 25-Nanometer Resolution, Science vol. 272, pp. 85-87, Apr. 5, 1996.

Chou et al., Imprint Lithography with Sub-10 nm Feature Size and High Throughput, Microelectronic Engineering 35, pp. 237-240, Jan. 1, 1997.

Haisma et al., Mold-assisted Nanolithography: A Process for Reliable Pattern Replication, J. Vac. Sci. Technol. B, pp. 4124-4128, Nov. 1, 1996.

Chou et al., Imprint of Sub-25 nm Vias and Trenches in Polymers, Appl. Phys. Lett. 67 (21), Nov. 20, 1995.

Johnson et al., Advances in Step and Flash Imprint Lithography, SPIE Microlithography Conference, Feb. 23, 2003.

Chou et al., Lithographically Induced Self-assembly of Periodic Polymer Micropillar Arrays, J. Vac. Sci. Technol. B 17 (6), pp. 3197-3202, Nov. 1, 1999.

Colburn et al., Step and Flash Imprint Lithography: A New Approach to High-Resolution Patterning, Proc. Of SPIE, vol. 3676, Mar. 1, 1999.

Heidari, Nanoimprint Lithography at the 6 In. Wafer Scale, J. Vac. Sci. Technol. B 18(6), pp. 3557-3560, Nov. 1, 2000.

Translation of Japanese Patent 02-92603.

Translation of Japanese Patent 02-24848.

Chou et al., Ultrafast and Direct Imprint of Nanostructures in Silicon, Nature, Col. 417, (Jun. 2002), pp. 835-837, Jun. 1, 2002.

Chou et al., Nanoimprint Lithography, Journal of Vacuum Science Technolgoy B 14(16), pp. 4129-4133, Nov. 1, 1996.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology. vol b. 19(6), Nov. 1, 2001.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Schneider et al., Stripes of Partially Fluorinated Alkyl Chains: Dipolar Langmuir Monolayers.

REVERSE TONE PATTERNING ON SURFACES HAVING PLANARITY PERTURBATIONS

BACKGROUND OF THE INVENTION

The field of invention relates generally to micro and/or nano-fabrication of structures. More particularly, the present invention is directed to forming relief structures in substrates.

Micro-fabrication involves the fabrication of very small structures, e.g., having features on the order of micro-meters or smaller. One area in which micro-fabrication has a sizeable impact is in the semiconductor processing industry for the manufacture of integrated circuits. As the semiconductor processing industry continues to strive for larger production yields while increasing the circuits per unit area formed on a substrate, micro-fabrication becomes increasingly important. Other areas of development in which micro-fabrication has been employed include biotechnology, optical technology, mechanical systems and the like.

Traditional micro-fabrication employs photolithography techniques to replicate patterns on substrates. Photolithography includes a combination of an exposure tool and an image transfer process. To that end, a process compatible masking layer, often referred to as a resist-layer, is employed to provide the desired pattern. That is, the material from which the resist-layer is fabricated is optimized for the exposure tool and the image transfer process. As a result, several factors are considered when determining the proper resist material, including the exposure wavelength and compatibility of the resist-layer material to post imaging processes, e.g., subsequent etch and deposition processes. In addition to the resist-layer, replicating patterns with well-defined features is dependent upon operational characteristics of the exposure tool. These characteristics include, and are not limited to, the numerical aperture of the exposure tool lens, wavelength employed and alignment systems.

Recently a new non-photolithographic patterning process has evolved, which is commonly referred to as imprint lithography, overcoming many of the complexities and limitations of exposure tool technology. Exemplary imprint lithographic processes are described in detail in numerous publications, such as U.S. published patent application Ser. No. 2004/0065976, filed as U.S. patent application Ser. No. 10/264960 on Oct. 4, 2002 and entitled METHOD AND A MOLD TO ARRANGE FEATURES ON A SUBSTRATE TO REPLICATE FEATURES HAVING MINIMAL DIMENSIONAL VARIABILITY; U.S. published patent application Ser. No. 2004/0065252, filed as U.S. patent application Ser. No. 10/264926 on Oct. 4, 2002 and entitled METHOD OF FORMING A LAYER ON A SUBSTRATE TO FACILITATE FABRICATION OF METROLOGY STANDARDS; and U.S. published patent application Ser. No. 2004/0046271, filed as U.S. patent application Ser. No. 10/235314 on Sep. 5, 2002 and entitled FUNCTIONAL PATTERNING MATERIAL FOR IMPRINT LITHOGRAPHY PROCESSES, all of which are assigned to the assignee of the present invention.

The fundamental imprint lithography technique disclosed in each of the aforementioned published patent applications includes formation of a relief pattern in a polymerizable layer and transferring a pattern corresponding to the relief pattern into an underlying substrate. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The substrate and the solidified layer are then subjected to processes to transfer, into the substrate, a relief image that corresponds to the pattern in the solidified layer.

Generally, control over the dimensions of the features formed with the aforementioned processes has been dependent upon the topology of the underlying surface in contact with the formable liquid. The greater anisotropy of the surface the greater the distortion in the relief image.

There is a need, therefore, to provide improved processes for forming relief structures on substrates containing topography.

SUMMARY OF THE INVENTION

The present invention features a method of patterning a substrate that includes forming, on the substrate, a first film having an original pattern that includes a plurality of projections a subset of which extends from a nadir surface terminating in an apex surface defining a height therebetween. A second film is disposed upon the first film and defines a surface spaced-apart from the apex surface of the plurality of projections. A variation in a distance between the apex surface of any one of the plurality of projections and the surface being within a predetermined range. A recorded pattern is transferred onto the substrate that corresponds to the original pattern, within the predetermined range being selected to minimize pattern distortions in the recorded pattern. These and other embodiments are described herein.

DETAILED DESCRIPTION OF THE INVENTION

Figure 1:
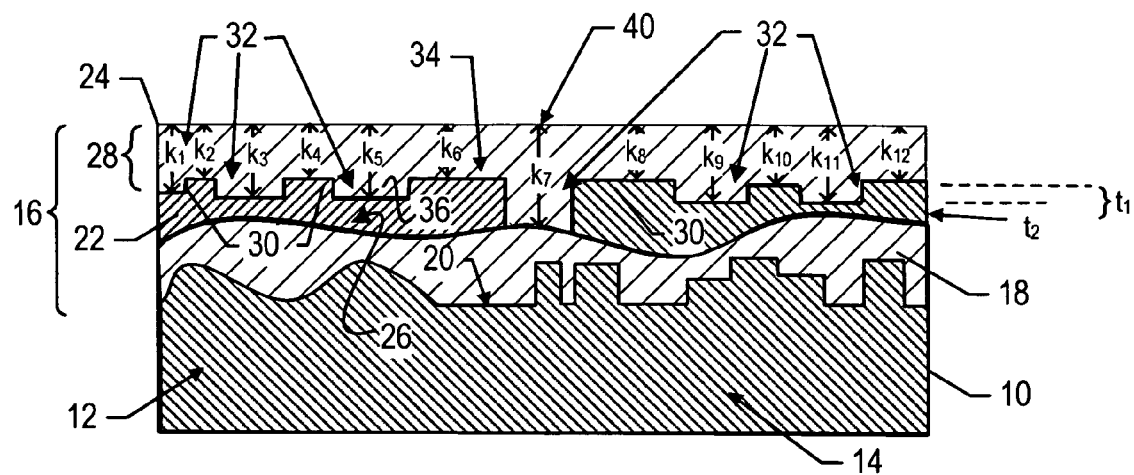
FIG. 1 is a simplified cross-sectional view of a multi-layered structure in accordance with one embodiment of the present invention.

Referring to FIG. 1, a substrate 10, patterned in accordance with the present invention, is shown having surface undulations 12 and surface polygonal structures 14. It is problematic to pattern substrate 10 with features having dimensions on the order of the dimensions of undulations 12 and polygonal structures 14, because the substrate 10 presents a non-planar, i.e., roughened topology, to the pattern process. As a result, undulations 12 and polygonal structures 14, commonly referred to as planarity perturbations, make difficult controlling feature dimensions of patterns formed on substrate 10. One of the advantages of the present invention is reducing, if not abrogating, problematic effects of planarity perturbations employing a multi-layer film stack 16 to pattern the substrate underlying the surface.

Multi-layer film stack 16 includes a primer layer 18 deposited on a surface 20 of substrate 10, a patterned layer 22 disposed upon primer layer 18, and an etch-differential layer 24 deposited upon patterned layer 22. Primer layer 18 functions to provide surface 26 with planarity perturbations having a frequency that is less than the frequency of the planarity perturbations in surface 20.

Patterned layer 22 and etch-differential layer 24 define an etch rate differential interface 28 that results from the relative etch rates and thicknesses of the materials from which patterned layer 22 and etch-differential layer 24 are formed. This facilitates formation, on substrate 10, of a pattern corresponding to a shape of patterned layer 22. For example, as shown, patterned layer 22 is provided with features that include projections 30 having a thickness $t_1$, and recessions 32 having a thickness $t_2$, measured between primer layer 18 and a bottom of recessions 32. Thickness $t_2$ is shown varying over the area of patterned layer 22 to the planarity perturbations that presents as curved surface in primer layer 18. Thickness $t_2$ is referred to as a residual thickness. Thicknesses "$t_1$" and "$t_2$" may be any thickness desired, dependent upon the application.

Each of projections 30 has an apex surface 34 and each of recessions 32 has a nadir surface 36. In the absence of etch-differential layer 24, the thickness differential between $t_1$ and $t_2$ of projections 30 and recessions 32, respectively, defines the amount of etch time required before exposing regions of substrate 10. Specifically, some or all of patterned layer 22 is sacrificed during the etching process to provide the desired dimensions of the pattern eventually recorded in substrate 10. Assuming a uniform thickness $t_2$, a greater amount of etch time is required to expose regions of substrate 10 in superimposition with projections 30 compared with the time required for regions of substrate 10 in superimposition with recessions 32. For a given etching process, therefore, etching will commence sooner in regions of substrate 10 in superimposition with recessions 32 than regions in superimposition with projections 30. This facilitates formation of a pattern in substrate 10 corresponding to the shape of patterned layer 22.

By properly selecting the imprinting materials and etch chemistries, the relational dimensions between the differing features of the pattern, referred to as etched pattern characteristics (EPC), eventually transferred onto substrate 10, i.e., the recorded pattern, may be controlled as desired. To that end, it is desired that the etch characteristics of patterned layer 22, for a given etch chemistry, be substantially uniform. However, the presence of planarity perturbations may result in exposure of some regions of substrate 10 in superimposition with projections 34 before exposure of regions of substrate 10 in superimposition with recessions 32. As a result features of the pattern may be lost, which is undesirable.

Etch-differential layer 24 provides added variability in a given pattern transfer process for a given patterned layer by modifying the EPC. This facilitates overcoming problems associated with the planarity perturbations. Specifically, for a given etch process and patterned layer 22, etch-differential layer 24 operates to modify the EPC by varying the time required before the etch chemistry breakthrough of all, or any sub-portion of, the patterned layer 22 to expose the region of substrate 10 in superimposition therewith.

The modification of the EPC is dependent upon several factors. One of these factors includes the relative etch rates of the materials from which patterned layer 22 and etch-differential layer 24 are formed. Another factor is the variation in the spacing between normalization surface 40 and an interface of patterned layer 22 with etch-differential layer 24, with the interface being referred to as etch rate interface (ERI) over the area of the ERI. The variations in distance between normalization surface 40 and the ERI are a function of the shape of the relative shapes of both normalization surface 40 and patterned layer 22. It is the volume of etch-differential layer 24 disposed between normalization surface 40 and the ERI that defines an etch-differential interface. Considering that all or some of etch-differential layer 24 and some or all of patterned layer 22 are sacrificed to form onto substrate 10 the desired recoded pattern, it is seen that etch differential interface 28 provides the modification to the EPC. By establishing a suitable etch-differential interface 28, the deleterious effects of planarity perturbations may be attenuated, if not avoided.

For example, as mentioned above, the planarity perturbations include undulations 12 and polygonal structures 14; however, it should be understood that the topology of surface 20 may include any known shape, including substantially smooth, if not planar regions over a substantial area thereof. Further, the entire surface 20 may comprise undulations 12, or the entire surface 20 may comprise polygonal structures 14. Further, surface 20 may comprise of silicon and any native oxide present thereon that is associated with a standard silicon wafer or may include an indium phosphate wafer, a gallium arsenide wafer, a gallium nitride wafer and the like. Furthermore, substrate 10 may include any one of the aforementioned wafers with one or more pre-existing layer deposited thereon, any one of which may be comprised of a metallic material, a dielectric material or combination thereof.

Primer layer 18 is applied to substrate 10 employing any known technique, e.g., chemical vapor deposition techniques, atomic layer deposition techniques, physical vapor deposition techniques, spin-coating techniques, imprint lithography techniques and the like. In the present example, primer layer 18 may be formed from a material available from Brewer Science, Inc. of Rolla Mo. under the trade name DUV30J-6 that is spun-on substrate 10. Primer layer 18 is typically provided with a thickness to function as an anti-reflective coating and provide a continuous, smooth, relatively defect-free surface that may exhibit excellent adhesion to material deposited thereon and without being opaque to optical sensing equipment employed to detect patterns, such as alignment marks (not shown), on substrate 10.

Both patterned layer 22 and etch-differential layer 24 are deposited using any known technique, e.g., chemical vapor deposition techniques, atomic layer deposition techniques, physical vapor deposition techniques, spin-coating techniques, imprint lithography techniques and the like. In the present example, patterned layer 22 and etch-differential layer 24 are formed employing imprint lithography techniques. An exemplary technique for forming patterned layer 22 employs depositing a plurality of droplets of imprinting material, referred to as a drop-dispense technique. An exemplary drop dispense technique is described in U.S. patent application Ser. No. 10/789,319 filed Feb. 27, 2004 entitled COMPOSITION FOR AN ETCHING MASK COMPRISING A SILICON-CONTAINING MATERIAL, which is assigned to the assignee of the present invention and incorporated by reference herein. Typically, drop dispense imprinting is practiced in a helium rich atmosphere, e.g., with helium being flowed into a process region at about 5 pounds per square inch, in a manner described in U.S. patent application Ser. No. 10/677,639, entitled SINGLE PHASE FLUID IMPRINT LITHOGRAPHY METHOD filed Oct. 2, 2003 and is incorporated by reference herein. An exemplary system is available under the trade name IMPRIO 100™ from Molecular Imprints, Inc. having a place of business at 1807-C Braker Lane, Suite 100, Austin, Tex. 78758. The system description for the IMPRIO 100™ is available at www.molecularimprints.com and is incorporated herein by reference.

Patterned layer 22 includes the features discussed above. Etch-differential layer 24 includes first and second opposed sides. The first side faces patterned layer 22 and has a profile complementary to the profile of the patterned layer 22. The second side faces away from patterned layer 22 forming a substantially smooth if not planar surface, defining a normalization surface 40.

The materials employed to form the patterned layer 22 and etch-differential layer 24 are selected to obtain the desired etch-differential interface 28. In one example, patterned layer 22 is a polymerized and cross-linked silicon-free material formed from the following composition:

COMPOSITION 1 isobornyl acrylate n-hexyl acrylate ethylene glycol diacrylate 2-hydroxy-2-methyl-1-phenyl-propan-1-one $R_1R_2$ The acrylate component isobornyl acrylate (IBOA) has the following structure:

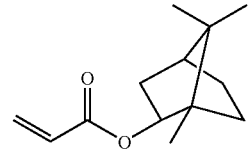

and comprises approximately 55% of COMPOSITION 1 by weight, but may comprise 20-80% of the same. As a result, the mechanical properties of patterned layer 22 are primarily attributable to IBOA. An exemplary sample of IBOA is available from Sigma-Aldrich of St. Louis, Mo. under product number 392103. The component n-hexyl acrylate (nHA) has the following structure:

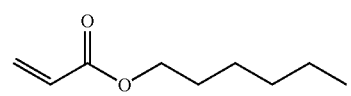

and comprises approximately 27% of COMPOSITION 1 by weight, but may comprise 0 to 50% of the same. Also providing mechanical strength to patterned layer 22, nHA is employed to provide the desired viscosity of COMPOSITION 1, in the liquid phase, to be in a range 2-9 Centipoises. Another advantage of nHA is that it improves the flexibility of COMPOSITION 1. An exemplary sample of nHA is available from Sigma-Aldrich of St. Louis, Mo. under product number 408905. A cross-linking component, ethylene glycol diacrylate, has the following structure:

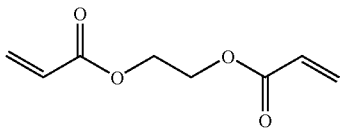

and comprises approximately 15% of COMPOSITION 1 by weight, but may comprise 10-50% of the same. EGDA facilitates cross-linking of nHA and IBOA during polymerization of COMPOSITION 1, as well as contributes to the modulus and stiffness build up. An initiator component, 2-hydroxy-2-methyl-1-phenyl-propan-1-one is available from Ciba Specialty Chemicals of Tarrytown, N.Y. under the trade name DAROCUR 1173, has the following structure:

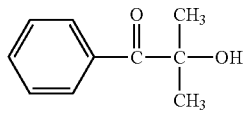

and comprises approximately 3% of COMPOSITION 1 by weight, but may comprise 0.1% to 5% of the same. The initiator is responsive to a broad band of ultra-violet radiation to facilitate cross-linking and polymerization of the components of COMPOSITION 1.

The component $R_1R_2$ is a surfactant having the general structure $R_1=F(CF_2CF_2)_y$, with y being in a range of 1 to 7, inclusive, and $R_2=CH_2CH_2O(CH_2CH_2O)_xH$, with X is in a range of 0 to 15, inclusive. The surfactant may be any known in the art that provides COMPOSITION 1 with suitable wetting properties in the liquid phase, as well as desired release characteristics in the solid phase. For purposes of this invention a surfactant is defined as any molecule, one tail of which is hydrophobic. Surfactants may be either fluorine-containing, e.g., include a fluorine chain, or may not include any fluorine in the surfactant molecule structure. An exemplary surfactant has the following general structure:

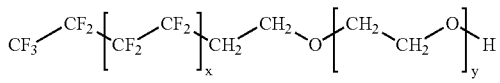

and is available under the trade name ZONYL® FSO-100 from DUPONT™, which consists of 0.25 to 2% of the composition, with the remaining components being reduced a proportionate amount.

In the present example, etch differential layer 24 is formed employing the drop-dispense technique discussed above with respect to patterned layer 22. As a result, a plurality of droplets (not shown) of imprinting material are deposited atop of patterned layer 22 and a planarization mold (not shown) is placed in contact therewith. Exemplary imprinting materials from which etch-differential layer 24 is a polymerized and cross-linked material formed from one of the following compositions:

COMPOSITION 2 acryloxymethylpentamethyldisiloxane isobornyl acrylate ethylene glycol diacrylate 2-hydroxy-2-methyl-1-phenyl-propan-1-one $R_1R_2$ COMPOSITION 2 differs from COMPOSITION 1 by the substitution of nHA with acryloxymethylpentamethyldisiloxane that has the following structure:

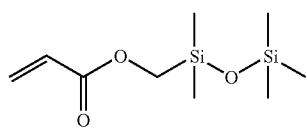

The remaining components of COMPOSITION 2 are that same as COMPOSITION 1, but are present in differing amounts. For example, IBOA of COMPOSITION 2 typically comprises approximately 37% of COMPOSITION 2, and EGDA and 2-hydroxy-2-methyl-1-phenyl-propan-1-one, comprising approximately 18% and 3%, respectively. The surfactant $R_1R_2$ is approximately 0.5% of the COMPOSITION.

COMPOSITION 3 acryloxymethylbis(trimethylsiloxy)methylsilane isobornyl acrylate ethylene glycol diacrylate 2-hydroxy-2-methyl-1-phenyl-propan-1-one $R_1R_2$ Composition 3 differs from COMPOSITION 2 only by the substitution of acryloxymethylpentamethyldisiloxane with acryloxymethylbis(trimethylsiloxy)methylsilane. The component acryloxymethylbis(trimethylsiloxy)methylsilane has the following structure:

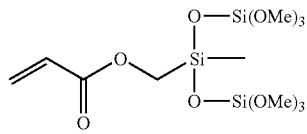

The relative quantities of each of the components of COMPOSITION 3 are the same as discussed with COMPOSITION 2.

Figure 2:
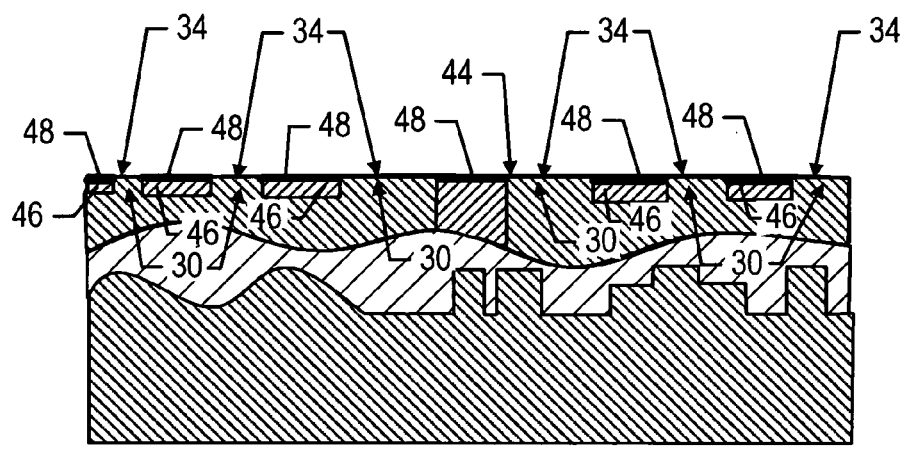
FIG. 2 is a simplified cross-sectional view after a blanket etch of the multi-layered structure, shown in FIG. 1, to form a crown surface in accordance with one embodiment of the present invention.

Referring to FIGS. 1 and 2, after formation of etch-differential layer 24 a blanket etch using, for example a RIE process with a halogen gas mixture of approximately 70%

$CF_4$ and 30% $O_2$, is employed to remove portions of etch-differential layer 24 substantially uniformly over a volume thereof to provide a crown surface 44. Other gas mixtures that may be include contains $CHF_3$, $SF_6$ and other fluorinated chemistries know to one of ordinary skill in the etching art. An exemplary etch chemistry is discussed by Johnson et al. in ADVANCES IN STEP AND FLASH IMPRINT LITHOGRAPHY, in a white paper distributed at the SPIE Microlithography Conference held in Santa Clara, Calif. from Feb. 23-Feb. 28, 2003. Crown surface 44 is defined by exposing the apex surface 34 of the projections 30. In the present example, adjacent apex surfaces 34 are separated by regions 46 of etch-differential layer 24 remaining after formation of crown surface 44.

Figure 3:
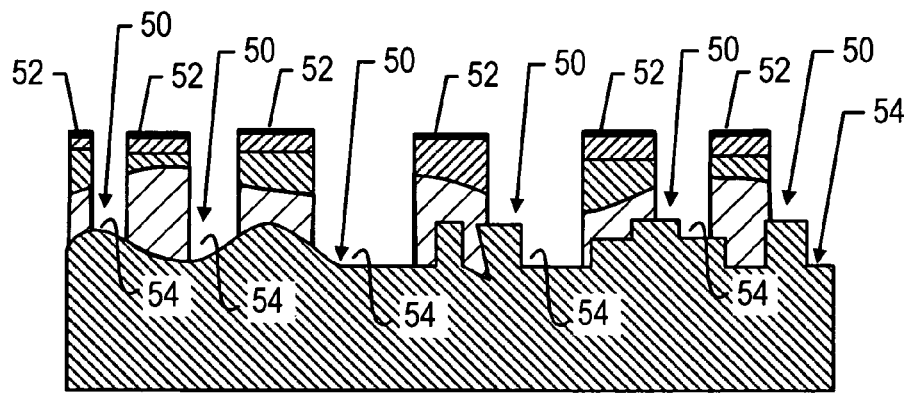
FIG. 3 is a simplified cross-sectional view of the multi-layered structure, shown in FIG. 2, after subjecting the crown surface to an etch to form recesses in portions of the substrate in accordance with one embodiment of the present invention.

Referring to FIGS. 2 and 3, crown surface is subjected to an anisotropic etch. The etch chemistry of the anisotropic etch is selected to take advantage of the etch-differential provided by crown surface 44 by maximizing etching of projections 30 and segments of patterned layer 22 in superimposition therewith, while minimizing etching of regions 46 in superimposition with recessions 32. In the present example, advantage was taken of the distinction of the silicon content between the patterned layer 22 and etch-differential layer 24. Specifically, employing an RIE etch with an oxygen-based chemistry, it was determined that an in-situ hardened mask 48 would be created in the regions 46 proximate to the surface thereof. This results from the interaction of the silicon-containing polymerizable material with the oxygen plasma. As a result of hardened mask 48 and the anisotropy of the etch process, portions of patterned layers are removed substantially uniformly over the volume thereof to expose regions 50 of substrate 10 in superimposition with projections 30. In this manner, a recorded pattern is formed that is defined by pillars 52 and recesses 54.

After exposure of regions 50, suitable etch processes, such as a types discussed above may be employed to transfer a pattern onto substrate 10 corresponding to the recorded pattern. Alternatively, or in conjunction therewith, the recorded pattern may be covered with a conductive material (not shown), such as aluminum, copper, tungsten, titanium, ti-tungsten or a combination thereof and the like, to, inter alia, fill recesses in furtherance of contact formation, discussed more fully below.

An advantage with the present invention is that control over the dimensions of the features is facilitated despite the presence of planarity perturbations on substrate 10. This is achieved by ensuring that normalization surface 40 is provided with a profile to ensure that distances $k_2, k_4, k_6, k_8, k_{10}$ and $k_{12}$ between apex surfaces 34 of each of projections 30 and normalization surface 40 are within a predetermined range. Specifically, normalization surface 40 is provided with a profile to ensure that the maximum difference between any two of distances $k_2, k_4, k_6, k_8, k_{10}$ and $k_{12}$ is less than ½ the height of the smallest projection 30. Control of variations between distances, $k_1, k_3, k_5, k_7, k_9$ and $k_{11}$ is not as critical so along as the measure of any one of distances $k_1$, $k_3, k_5, k_7, k_9$ and $k_{11}$ is no less than the measure of the largest distance among distances $k_2, k_4, k_6, k_8, k_{10}$ and $k_{12}$. With this criteria being satisfied, the distortions occurring during formation of recorded pattern is substantially independent of the planarity perturbations, by decoupling the resolution of the patterning process from the resulting variations in the thickness $t_2$ over the area of patterned layer 22.

It was also determined that the resolution of the patterning process may be substantially decoupled from the thickness $t_2$, in addition to the variations in the same. Specifically, without the presence of etch-differential layer 24, the aspect ratio of the recorded pattern was defined, in part, by the difference between $t_2$ and $t_1$. In the absence of planarity perturbations, $t_2$ being on the order of the size of $t_1$, or larger than $t_1$, would result in no features being be produced in the recorded pattern. As a result, it was highly desired to minimize the thickness of $t_2$. Further, the presence of planarity perturbations, control over thickness $t_2$ becomes problematic, because the same varies over the area of patterned layer 22. This may also result in a loss of pattern features. Specifically, assume a maximum value of $t_2$, $t_{2max}$, and a minimum value of $t_2$, $t_{2min}$. Were the difference between $t_{2max}$ and $t_{2min}$ on the order of the size of $t_1$, or larger than $t_1$, features in the recorded pattern would be lost. Further, the speed at which the patterning process occurred was often decreased due to the time required to fill the features of a template (not shown). Also, the time required to imprint increased as the feature dimensions on the template decreased, particularly with low viscosity imprinting materials, e.g., having a viscosity of less than 25 Centipoises, wherein the patterning process is dominated by the capillary forces of the imprinting material with the template (not shown). Although compressive forces may be applied to reduce the time required to fill the features of the template (not shown), there are limits, e.g., the mechanical strength of the underlying substrate 10 to mention one. The mechanical strength of substrate 10 becomes a limitation when patterning materials having high viscosity, e.g., in a range of 25 to 10,000 Centipoises. At the greater range of viscosity the patterning process becomes dominated by viscous forces of the imprinting material, as opposed to capillary forces. The compressive force required to pattern an imprinting material is believed to increase cubically as thickness $t_2$ decreases.

With the present invention, variations in the thickness $t_2$, as well as the overall thickness may be modified without unduly deteriorating the resolution of the features to be formed in recorded pattern. For example, the difference between $t_{2max}$ and $t_{2min}$ may be the same size or greater than $t_1$. Additionally, thickness $t_2$ may be the same size as the thickness $t_1$, or may be two to ten times greater than $t_1$. An advantage with substantially increasing the thickness $t_2$ is that the compressive forces required to achieve an imprint process may be substantially independent of thickness $t_2$, which facilitates patterning process dominated by viscous forces. Further, increasing thickness $t_2$ facilitates reversing the tone of the pattern formed in substrate so that the tone may be commensurate with the tone of the pattern of patterned layer 22.

Figure 4:
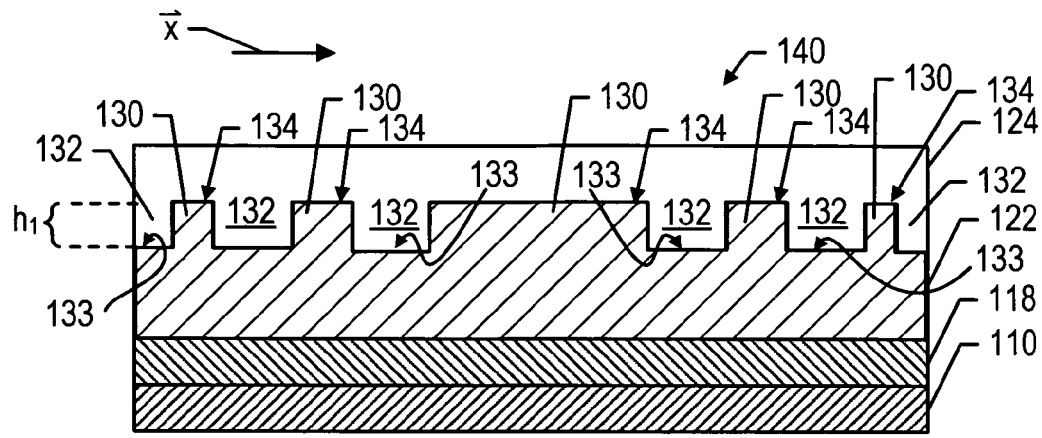
FIG. 4 is a simplified cross-sectional view of the multi-layer structure in accordance with an alternate embodiment.

Referring to FIGS. 1 and 4 a substrate 110 is shown including a primer layer 118, a patterned layer 122 and an etch-differential layer 124 disposed thereon, which correspond to primer layer 18, patterned layer 22 and etch-differential layer 24, respectively. Patterned layer 122 includes a plurality of projections 130 and recessions 132 that are analogous to projections 30 and recession 32. Projections 130 extend from a nadir surface 133, a distance $h_1$, terminating in an apex surface 134. A normalization surface 140, defined by etch differential layer 124, is spaced-apart from projections 130 in a manner discussed above with respect to normalization surface 40 and projections 30.

Figure 5:
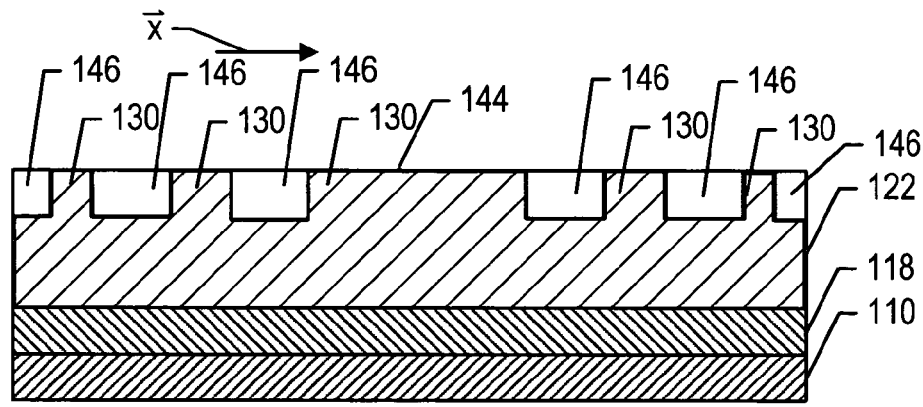
FIG. 5 is a simplified cross-sectional view of the multi-layer structure shown in FIG. 4 after being subjected to a blanket etch.

Referring to FIGS. 1, 4 and 5, etch differential layer 124 is subjected to a blanket etch to form conformal surface 144 in a manner discussed above with respect to forming conformal surface 44. To that end, conformal surface 144 is defined by exposed apex surface 134 separated by regions 146 of etch differential layer 124.

Figure 6:
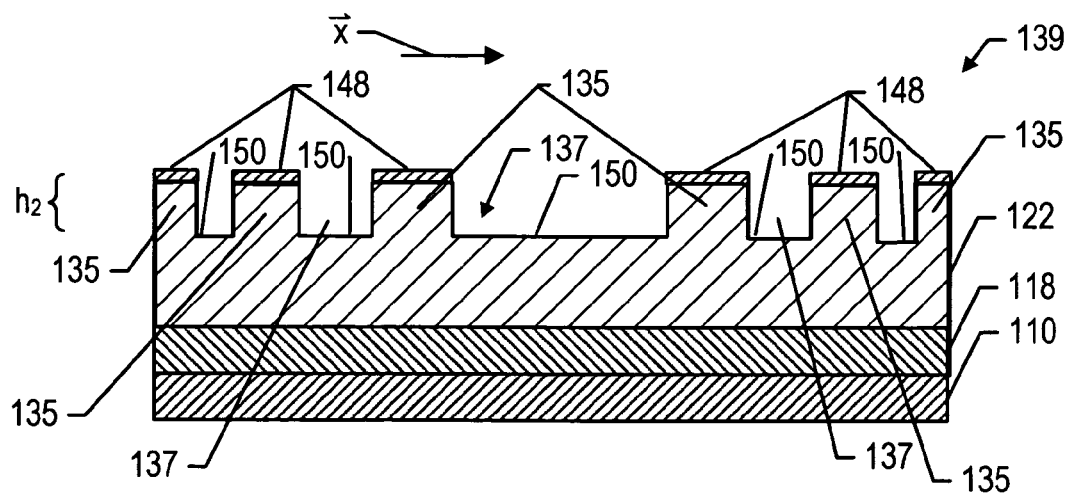
FIG. 6 is a simplified cross-sectional view of the multi-layered structure, shown in FIG. 5, after subjecting a crown surface to an etch to form recesses in a primer layer.

Referring to FIGS. 5 and 6, following formation of crown surface 144, an RIE process with oxygen based chemistry is employed to remove projections 130 and the portions of patterned layer 122 in superimposition therewith to expose regions 150 of patterned layer 122, forming projections 135, spaced apart by recessions 137. Projections 135 include a hard mask 148 of the material from which etch-differential layer 124 is formed. Regions 150 may be closer, further or the same distance from substrate 110 than nadir surfaces 133, dependent upon the application. A height, $h_2$, of projections 135 is defined as a function of the distance regions 150 are from substrate 110. In the present example, regions 150 are closer to substrate 110 than nadir surface 133 and provide projections 135 with a height equal to distance $h_1$. Further, projections 135 are shifted in phase along the x-direction with respect to projections 130. Particularly, projections 135 are in superimposition with the same regions of substrate 110 with which recessions 132 are in superimposition. Moreover, the dimensions of projections 135 are defined by regions 146.

Figure 7:
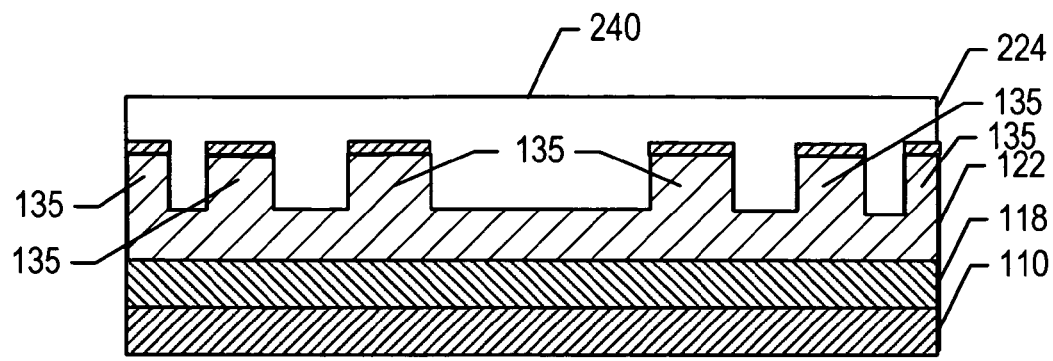
FIG. 7 is a simplified cross-sectional view of the multi-layer structure shown in FIG. 6 after deposition of a second etch differential layer.

Referring to FIGS. 6 and 7, after projections 135 have been formed, a second etch-differential layer 224 is deposited over projection 135, filling recessions 137. Etch-differential layer 224 is formed from the material as discussed with respect to etch differential layer 124. Etch differential layer 224 has a normalization surface 240 configured in the manner discussed with respect to normalization surface 240.

Figure 8:
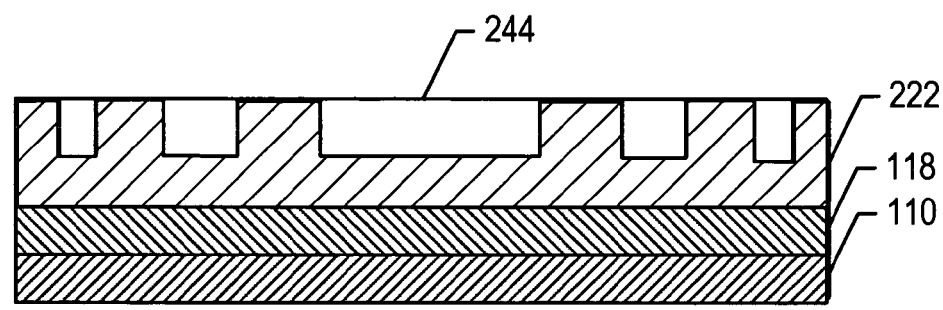
FIG. 8 is a simplified cross-sectional view of the multi-layer structure shown in FIG. 7 after being subjected to an additional blanket etch.
Figure 9:
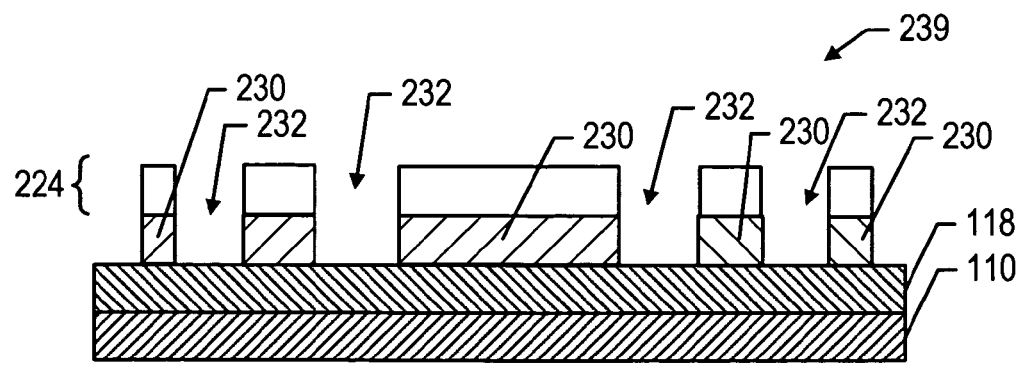
FIG. 9 is a simplified cross-sectional view of the multi-layer structure shown in FIG. 8 after formation of recesses employing an anisotropic etch.

Referring to FIGS. 7, 8, and 9, a crown surface 244 is generated in a manner discussed above with respect to crown surface 144. This is followed by removal of projections 135. The result is that a pattern 239, having a plurality of projections 230 and recessions 232, is generated on substrate 110 that has the same tone as the pattern in the patterned layer 122, i.e., one may invert the pattern obtained by the process discussed with respect to FIGS. 1-3. Additionally, as shown pattern 239 is shifted in phase along the X-direction with respect to pattern 139, with the understanding that pattern 239 may shift in phase along the Y-direction, which is into the page of FIGS. 1-3. Specifically, pattern 239 is shifted in phase in a direction so that projections 230 are in superimposition with the same regions of substrate 110 with which projections 130 are in superimposition. Pattern 139, therefore, is said to be shifted 180° out of phase along the X and Y-directions with respect to pattern 239. Subsequently, the remaining portions of etch differential layer 224 may be removed. By appropriately selecting the characteristics of the etch process, the features of the pattern may be greater than, less than or equal to the dimensions of the features in the patterned layer 122.

Another advantage with the tone reversal is found when fabricating patterned layer 22 employing imprint lithography techniques. It has been found that filling of features on a template (not shown), such as recesses may be difficult if the same are too small. With the tone reversal process, the recess may be fabricated in the template (not shown) as protrusions with the same being subsequently formed into a recorded pattern as recessions. In other words, the tone of the pattern in the template may be chosen independent of the recorded tone of the recorded pattern desired. Instead, the tone of the pattern in the template may be selected to satisfy other operational characteristics of the imprint process, e.g., throughput by decreasing feature fill-time.

Figure 10:
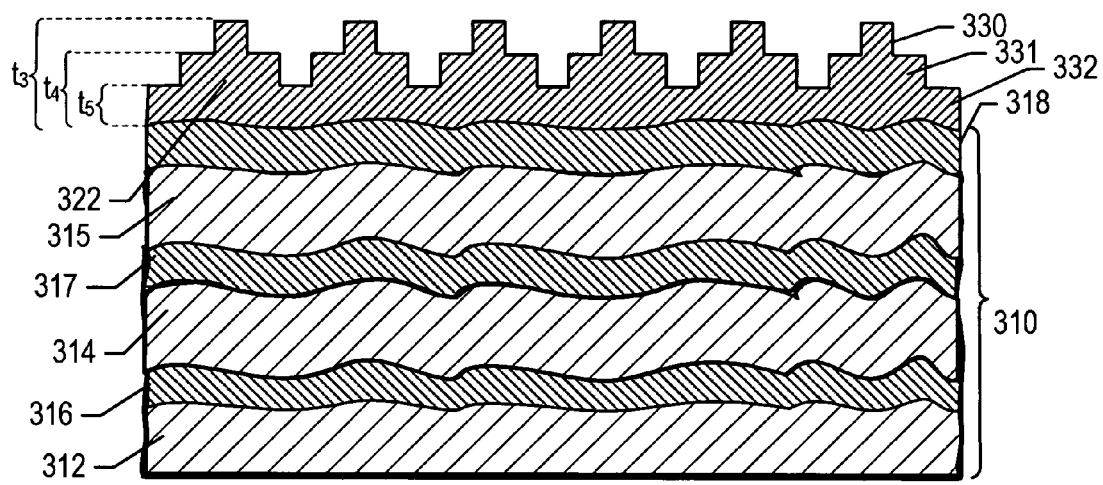
FIG. 10 is a simplified cross-sectional view of a patterned layer disposed upon a substrate in accordance with one embodiment of the present invention.

It should be understood that the benefits of the aforementioned processes is not limited to forming patterns having single-recessed-level features, as discussed above, but may also be employed forming patterns having bi-level recessed features, i.e., stepped features. For example, referring to FIGS. 10 and 11, patterned layer 322 is shown having a plurality of features formed on substrate 310, which include projections 330 having a thickness $t_3$, shoulders 331 having a thickness $t_4$ and sub-portions 332 having a thickness $t_5$. Projection 330 and shoulders 331 define a bi-level projection on surface of substrate 310. Thickness $t_5$ is referred to as a residual thickness. Thicknesses "$t_3$", "$t_4$" and "$t_5$" may be any thickness desired, dependent upon the application.

An inverse shape of patterned layer 322 is transferred onto substrate 310 to form a via portion (not shown) and a trench portion (not shown) therein, discussed more fully below. In this manner, the dimensions of the via portion (not shown) are established as a function of the dimensions of projections, and the dimensions of the trench portion (not shown) are established as a function of the dimensions of the shoulders. To that end, substrate 310 may include several preexisting layers disposed upon a wafer 312, shown as layers 314, 315 separated by etch stop layers 316, 317 and 318. Etch-differential layer 324 is disposed adjacent to patterned layer 322. Substrate 310, patterned layer 322 and etch-differential layer 324 define a multi-layered structure 338.

Figure 11:
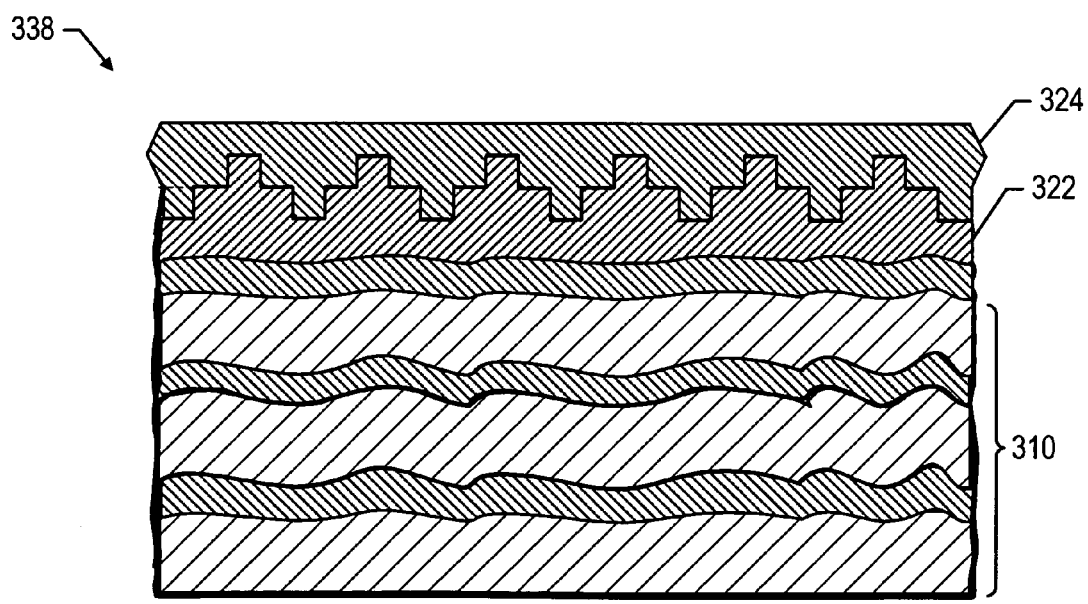
FIG. 11 is a simplified cross-sectional view of a multi-layered structure, formed by deposition of an etch-differential layer upon the patterned layer, shown in FIG. 10.
Figure 12:
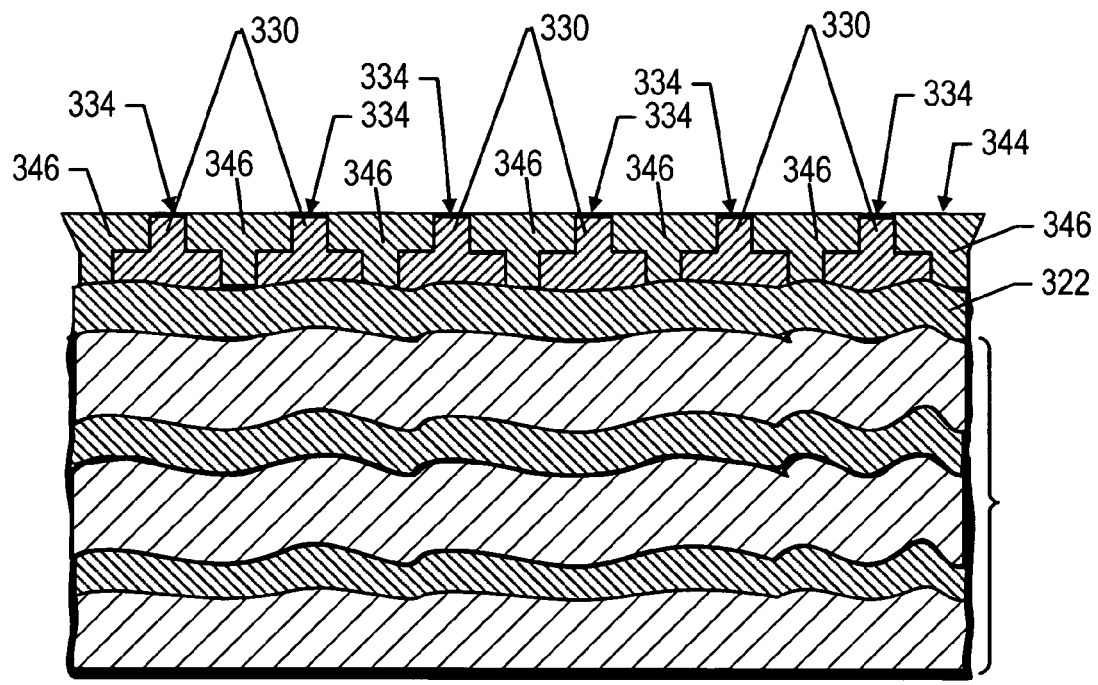
FIG. 12 is a simplified cross-sectional view of the multi-layered structure, shown in FIG. 11, after subjecting the same to a blanket etch to form a crown surface.

Referring to FIGS. 11 and 12, a blanket etch is employed to remove portions of etch-differential layer 324 to provide multi-layered 338 structure with the crown surface 344. Crown surface 344 is defined by an exposed apex surface 334 of each projection 330 and regions 346 that remain of etch-differential layer 324 after the blanket etch.

Figure 13:
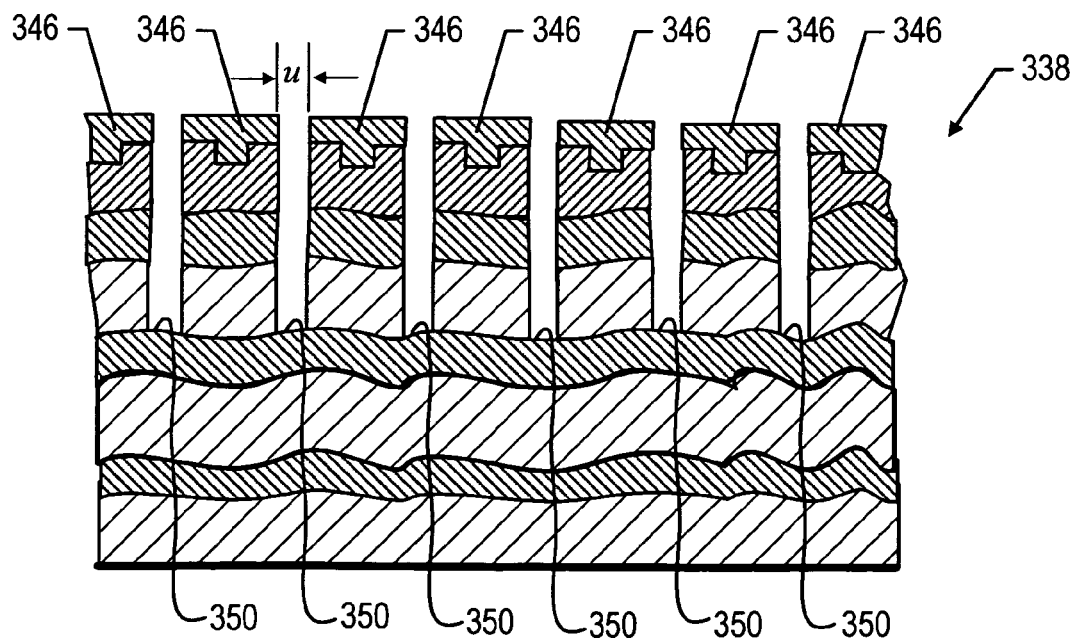
FIG. 13 is a simplified cross-sectional view of the multi-layered structure, shown in FIG. 12 after subjecting the crown surface to an etch to form via portions in the substrate in accordance with one embodiment of the present invention.

Referring to FIGS. 12 and 13, crown surface 344 is subjected to an anisotropic etch. The etch chemistry of the anisotropic etch is selected to maximize etching of projections 330 and the segments of patterned layer 322 in superimposition therewith, while minimizing etching of the regions 346. In the present example, advantage was taken of the distinction of the silicon content between the patterned layer 322 and regions 346 to expose regions 350 of substrate 310, as discussed above with respect to regions 46 and patterned layer 22 with respect to FIGS. 2 and 3.

Figure 14:
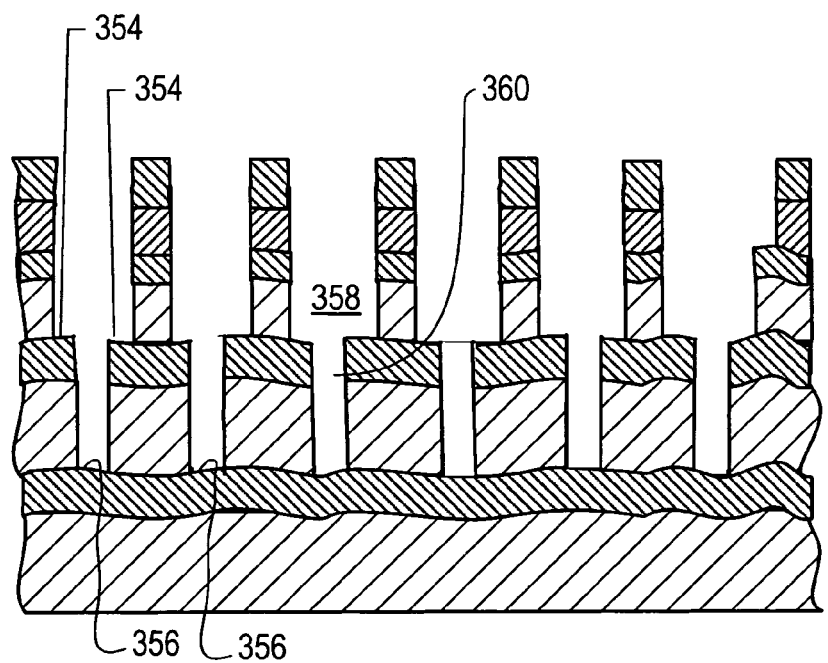
FIG. 14 is a simplified cross-sectional view of the multi-layered structure, shown in FIG. 13, after subjecting the same to an anisotropic etch to form trench portions aligned with the via portions in accordance with one embodiment of the present invention.
Figure 15:
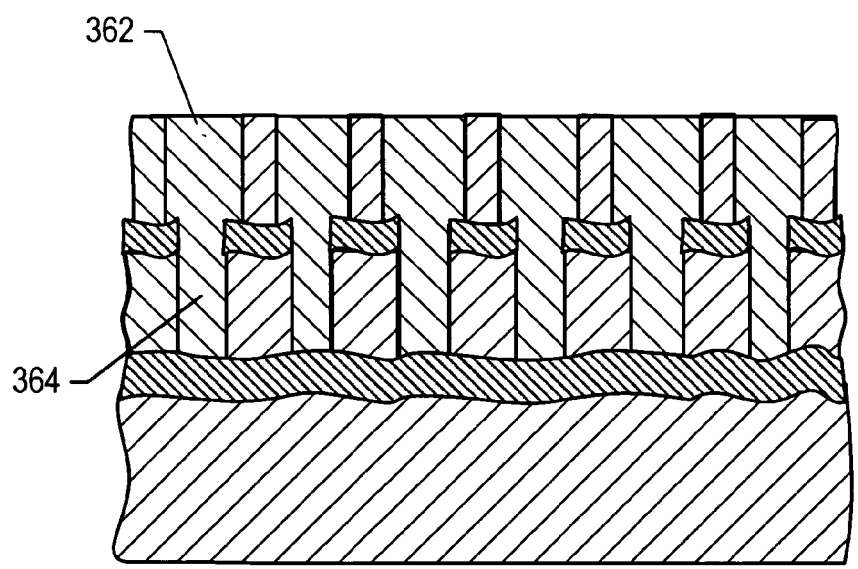
FIG. 15 is a simplified cross-sectional view of the multi-layered structure, shown in FIG. 14, after deposition of conductive material in the via portion and trench portion in accordance with one embodiment of the present invention.

Referring to FIGS. 13 and 14, after exposure of regions 350, suitable etch processes, including the processes discussed above, are employed to remove regions 346 and portions of multi-layered structure 338 in superimposition with regions 346 to expose regions 354 and 356. Regions 354 and 356 define a trench portion 358 and a via portions 360. A subsequent etch process or lift-off process is employed to remove remaining portions of layers 322 and 324. Thereafter, via portion 360 and trench portion 358 may be concurrently filled with a conductive material, such as aluminum, copper, tungsten, titanium, ti-tungsten or a combination thereof and the like, to form a contact 362 and a conductive line 364, shown in FIG. 15.

Referring to FIGS. 2, 13 and 14, the advantages of this process are manifold. For example, self-aligned vias and trenches may be formed in substrate 310 while precisely controlling the dimensions thereof. This reduces transfer distortions that may be attributable to planarity perturbations.

Although the foregoing has been discussed with respect to forming etch-differential layer 24 using drop-dispense techniques, etch-differential 24 layer may be formed employing spin-on techniques as discussed in U.S. patent application Ser. No. 10/789,319 filed Feb. 27, 2004 entitled COMPOSITION FOR AN ETCHING MASK COMPRISING A SILICON-CONTAINING MATERIAL. To that end, the following compositions may be employed:

COMPOSITION 4 hydroxyl-functional polysiloxane hexamethoxymethylmelamine toluenesulfonic acid methyl amyl ketone

COMPOSITION 5 hydroxyl-functional polysiloxane hexamethoxymethylmelamine gamma-glycidoxypropyltrimethoxysilane toluenesulfonic acid methyl amyl ketone In COMPOSITION 4, hydroxyl-functional polysiloxane comprises approximately 4% of the composition, hexamethoxymethylmelamine comprises approximately 0.95%, toluenesulfonic acid comprises approximately 0.05% and methyl amyl ketone comprises approximately 95%. In COMPOSITION 5, hydroxyl-functional polysiloxane comprises approximately 4% of the composition, hexamethoxymethylmelamine comprises approximately 0.7%, gamma-glycidoxypropyltrimethoxysilane comprises approximately 0.25%, toluenesulfonic acid comprises approximately 0.05%, and methyl amyl ketone comprises approximately 95%.

Both COMPOSITIONS 4 and 5 are made up of at least 4% of the silicone resin. Upon curing, however, the quantity of silicon present in etch-differential layers 24, 124, 224 and 324 is at least 10% by weight and typically in a range of 20% or greater. Specifically, the quantity and composition of the solvent present in COMPOSITIONS 4 and 5 is selected so that a substantial portion of the solvent evaporates during spin-coating application of the COMPOSITIONS 4 or 5 on patterned layers 22, 122 and 322. In the present exemplary silicon-containing material, approximately 90% of the solvent evaporates during spin-coating. Upon exposing the silicon-containing material to thermal energy, the remaining 10% of the solvent evaporates, leaving etch-differential layer 24, 124, 224 and 324 with approximately 20% silicon by weight.

An exemplary method of forming etch-differential layers 24, 124, 224 and 324 includes spinning-on approximately 4 mL of the silicon-containing material deposited proximate to a center of the previously deposited layer. To that end, substrates 10, 110 or 310 are spun at 1000 rev/min for 1 minute by placing substrate 10, 110 or 310 on a hot plate. Thereafter, the silicon-containing material is subjected to thermal energy by baking at 150° C. for 1 min. This produces the silicon-containing material from which etch-differential layer 24, 124, 224 and 324 is formed, with thickness variations of 20 nm or less. Were it desired to increase the thickness of the solidified silicon-containing layer, e.g., to provide the solidified silicon-containing layer with a thickness of 200 nm, the aforementioned spin-coating and curing processes are simply repeated. As a result, the solvent employed is selected so as not to remove, "wash away," silicon-containing material in a well-cured etch-differential layer.

Referring to FIGS. 1-14, it has been determined, however, that forming patterned layers 22, 122 and 322 from a modified composition consisting of a mixture of COMPOSITIONs 1 and 2, when used in conjunction etch differential layers 24, 124, 224 and 324, respectively, formed from one of COMPOSITIONs 4 and 5 provided superior control over the anisotropy of the recessions in the recorded pattern. The modified composition provides layers 22, 122 and 322 with approximately 2-6% of silicon by weight. To that end, an exemplary modified composition consists of 20-70% of COMPOSITION 2, with the remainder consisting of COMPOSITION 1. This provided a silicon content differential between one of patterned layers 22, 122 and 322 and one of etch differential layers, 24, 124, 224 and 324. Specifically, by silylating patterned layers 22, 133 and 322 with low concentrations of silicon bowing of recessions e.g., recessions 32, 132 and 137 and 232, was reduced, if not avoided. Further control over formation of the aforementioned recessions was achieved by cooling substrates 10, 110 and 310 to approximately zero degrees Celsius, as well as by employing reducing chemistries in lieu of the aforementioned oxidizing chemistries during etching. Exemplary reducing chemistries include $H_2/N_2$, $CO/N_2$, $CH_4/N_2$ and the like.

Additionally, should circumstances warrant, the aforementioned processes may be altered to take advantage of the material of the layer upon which pattern occurs. For example, it is possible to form patterned layers 22, 122 and 322 from COMPOSITIONS 2, 4 or 5, with etch-differential layers 24, 124, 224 and 324 being formed from COMPOSITION 1. With this configuration, it might be beneficial to form primer layer 18 from one of COMPOSITIONS 2-5, i.e., were the surface upon which primer layer 18 disposed formed from a non-silicon containing organic material. Additionally, it is possible to form primer layer 18 from COMPOSITION 1. The etch process employed would be established to provide the desired etch selectivity in the manner similar to that described above.

Figure 16:
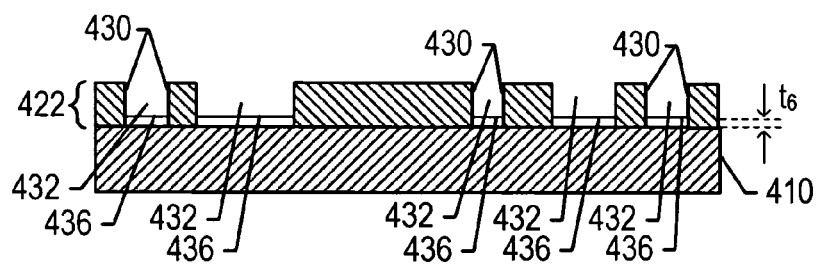
FIG. 16 is a cross-sectional view of a substrate patterned with an organic acrylate material in accordance with an alternate embodiment of the present invention.

Referring to FIG. 16, other processes in which an organic patterned layer functions as a sacrificial patterning layer may include formation of metal lines. To that end, patterned layer 422 is deposited on substrate 410 employing any known deposition method. In the present example, patterned layer 422 is formed from COMPOSITION 1 employing imprint lithography generated by a plurality of spaced-apart projections 430 and recessions 432. A nadir portion 436 of recessions 432 has a residual thickness $t_6$.

Figure 17:
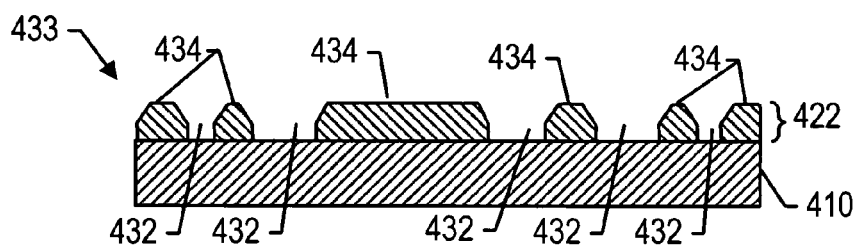
FIG. 17 is a cross-sectional view of the substrate shown in FIG. 16 with nadir regions removed.

Referring to FIGS. 16 and 17, patterned layer 422 is subjected to an etch process, such as an RIE oxygen etch discussed above, to remove nadir portions 436. As a result of this process, pattern 433 is formed on substrate 410. A deleterious effect that occurs during removing of nadir portions 436 is that an apex surface 434 of each of projections 430 assumes a faceted shape.

Figure 18:
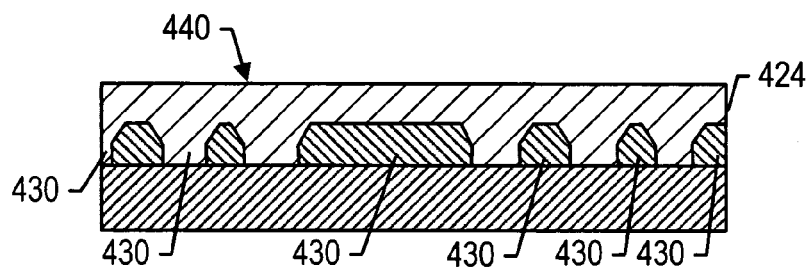
FIG. 18 is a cross-sectional view of the substrate shown in FIG. 17 with a conductive layer disposed thereon.

Referring to FIGS. 17 and 18, a conductive material is deposited to cover pattern 433, including apex surfaces 434 forming a conductive layer 424 having a conforming side, conforming to a shape of pattern 433 and normalization side 440 disposed opposite to conforming side. Normalization side 440 is spaced-apart from projections 430. An exemplary conductive material is copper, but may include any of the conductive materials mentioned above.

Figure 19:
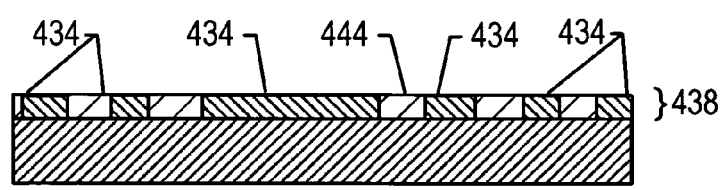
FIG. 19 is a cross-sectional view of the substrate shown in FIG. 18 after chemical mechanical polishing/planarization.

Referring to FIGS. 18 and 19, following deposition of conductive layer 424, normalization side 440 is subjected to suitable processes to form multi-layer structure 438. A suitable process may include a chemical mechanical polishing/planarization (CMP) process forming, were conductive layer 424 formed from metal, or blanket etch were a conductive layer 424 formed from a conductive polymer. In the present example, a CMP process is employed to achieve formation of a substantially smooth, if not planar, crown surface 444. To that end, the CMP process is selected based upon the material from which patterned layer 422 and conductive layer 424 are formed so that apex surfaces 434 are exposed in normalization surface having a substantially planar profile. Specifically, the faceted shape of apex surfaces is removed while providing crown surface 444 with a substantially smooth if not planar profile.

Figure 20:
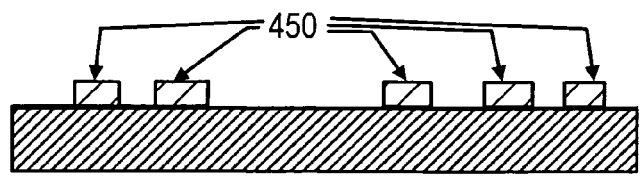
FIG. 20 is a cross-sectional view of the substrate shown in FIG. 19 after removal of the organic acrylate material.
Figure 21:
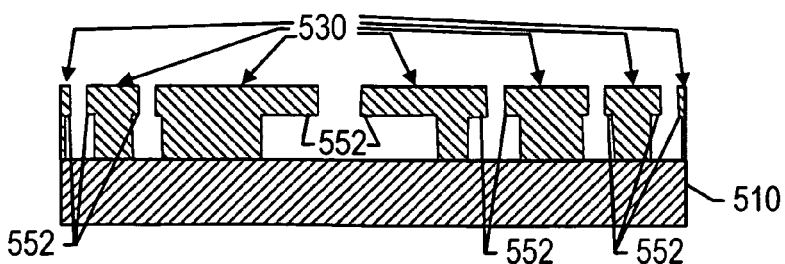
FIG. 21 is a cross-sectional view of the substrate shown in FIG. 20 in accordance with an alternate embodiment.

Referring to FIGS. 19 and 20, following formation of crown surface 444, multi-layer structure 438 is subjected to an RIE process and oxygen-based chemistry, as discussed above. The etch process removes projection 430, leaving a plurality of spaced-apart metal lines 450. It should understood that the this same process may be employed to form metal lines 550 with stepped shapes, e.g., a pair of spaced-apart shoulders 552 disposed between an apex surface 530 and substrate 510, shown in FIG. 21.

Figure 22:
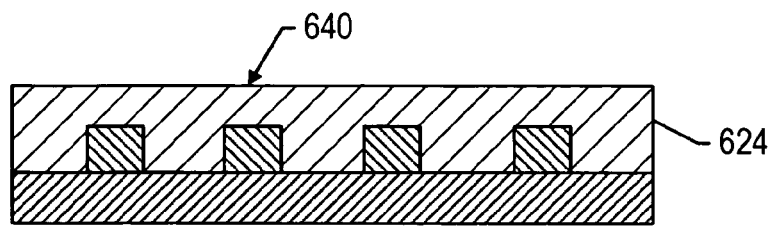
FIG. 22 is a cross-sectional view of the substrate shown in FIG. 17 with a dielectric layer disposed thereon.

Referring to FIGS. 17 and 22, projections 430 may be covered with a non-conductive material, e.g., a dielectric material, to form dielectric layer 624. Exemplary dielectric materials included of dielectric materials applicable for this purpose are silsesquioxanes and methyl-silsesquioxanes, spin-on glass that are applied employing conventional deposition techniques. Dielectric layer 624 covers pattern 433, including apex surfaces 434. As a result, dielectric layer 30 includes a conforming side, conforming to a shape of pattern 433 and normalization side 640 disposed opposite to conforming side. Normalization side 640 is spaced-apart from projections 630.

Figure 23:
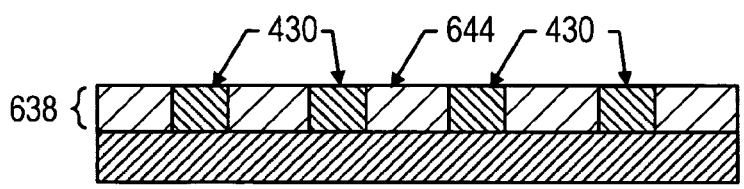
FIG. 23 is a cross-sectional view of the substrate shown in FIG. 22 after being subjected to a blanket etch.

Referring to FIGS. 22 and 23, following deposition of dielectric layer 624, normalization side 640 is subjected to a blanket etch, such as a $CF_4/O_2$ plasma or $CHF_3/O_2$ plasma etch, to expose apex surfaces 434 of projections 430, forming a multi-layer structure 638 having a crown surface 644. Crown surface 644 is formed to be substantially smooth, if not, planar.

Figure 24:
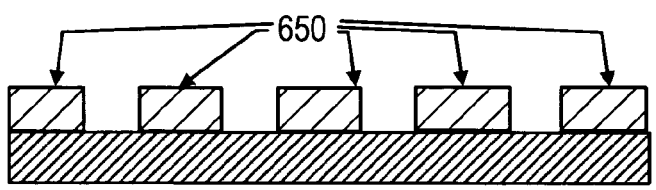
FIG. 24 is a cross-sectional view of the substrate shown in FIG. 23 after removal of the organic acrylate material.

Referring to FIGS. 23 and 24, following formation of crown surface 644, multi-layer structure 638 is subjected to an etch process that includes RIE with an oxygen plasma chemistry as discussed above. The etch process removes projections 430, leaving a plurality of spaced-apart dielectric pillars 650. It should be understood that the same process may be employed to form dielectric pillars with stepped shapes, as discussed above.

Figure 25:
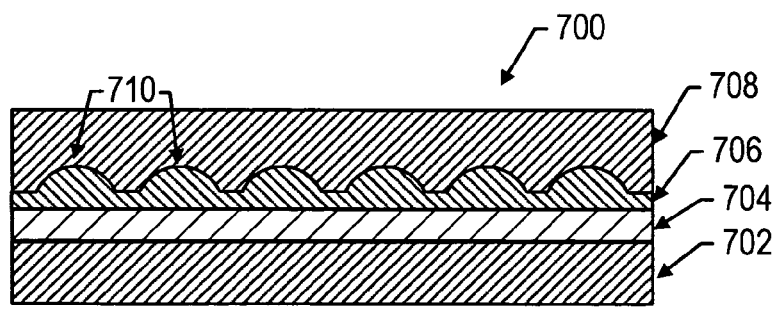
FIG. 25 is a simplified cross-sectional view of the multi-layer structure in accordance with an alternate embodiment.
Figure 26:
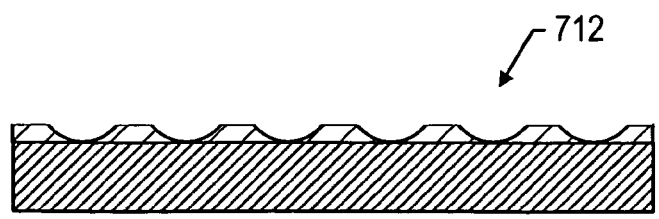
FIG. 26 is a simplified cross-sectional view of the multi-layer structure shown in FIG. 25 after subjecting the same to the process of FIGS. 4-9, with the etching chemistry having a low etch selectivity.
Figure 27:
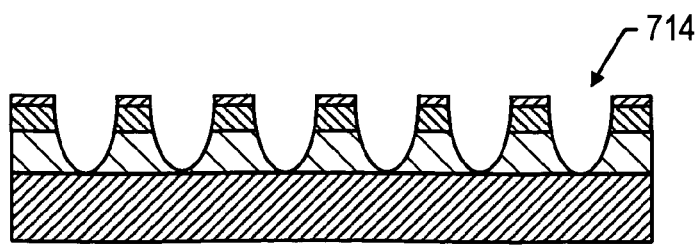
FIG. 27 is a simplified cross-sectional view of the multi-layer structure shown in FIG. 25 after subjecting the same to the process of FIGS. 4-9, with the etching chemistry having a high etch selectivity.

Referring to FIG. 25, a multi-layered structure 700 is shown having a substrate 702, a primer layer 704, a patterned layer 706 and an etch-differential layer 708. Patterned layer 706 includes projections 710, with projections 710 being arcuate in shape. Multi-layered structure 700 may be subjected to the process mentioned above with respect to FIGS. 4-9, thus resulting in the formation of multi-layered structures 712 and 714, shown in FIGS. 26 and 27, respectively. In a first embodiment, the etching chemistry is such that a low etch selectivity is achieved between the patterned layer 706 and the etch-differential layer 708. In a second embodiment, the etching chemistry is such that a high etch selectivity is achieved between the patterned layer 706 and the etch-differential layer 708. Further processes can be undertaken that would result in different patterns being etched into substrate 702 that might be useful for generating optical elements. Particularly, by tailoring the relative etch rates, and relative thicknesses of differential layer 708, patterned layer 706 and primer layer 704, the EPC may be modified so that the recorded pattern substantially differs from the pattern in of the patterned layer 706. It should be understood that the etch characteristics of primer layer 704 are similar to the etch characteristic of patterned layer 706. Furthermore, primer layer 704 is optional and may be omitted, dependent upon the application.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A method of patterning a substrate having surface planarity perturbations, said method comprising:
   forming, on said substrate, a first film having an original pattern that includes a plurality of projections a subset of which extends from a nadir surface terminating in an apex surface defining a height therebetween;
   disposing, upon said first film, a second film defining a normalization surface spaced-apart from said apex surface of said plurality of projections, with a variation in a distance between said apex surface of any one of said plurality of projections and said normalization surface being within a predetermined range; and
   transferring onto said substrate, a recorded pattern corresponding to said original pattern, with said predetermined range being selected to minimize pattern distortions in said recorded pattern.

2. The method as recited in claim 1 wherein forming further includes forming said second film to provide said variation that is less than ½ said height.

3. The method as recited in claim 1 wherein forming further includes forming said first film to provide said subset of projections with a shoulder disposed between said apex surface and said nadir surface.

4. The method as recited in claim 1 wherein transferring further includes selectively removing portions of said first and second films to expose portions of said substrate in superimposition with said projections while avoiding exposure of areas of said substrate outside of said portions.

5. The method as recited in claim 1 wherein disposing further includes providing said normalization surface with a smooth profile.

6. The method as recited in claim 1 wherein disposing further includes providing said normalization surface with a planar profile.

7. The method as recited in claim 1 wherein forming further includes providing said first film with a first etch rate and disposing further includes providing said second film with a second etch rate, and transferring further including removing one of said first and second films uniformly over a volume thereof.

8. The method as recited in claim 1 wherein forming further includes forming said first film with a first substantially free of silicon and depositing further includes providing said second film with a quantity of silicon.

9. The method as recited in claim 1 wherein forming further includes forming said first film using a deposition process selected from a set of deposition processes consisting essentially of chemical vapor deposition, plasma enhanced chemical vapor deposition, spin coating, atomic layer deposition, drop dispense imprinting, and electron beam pattern.

10. The method as recited in claim 9 wherein depositing further includes depositing said second film using a deposition process selected from a set of deposition processes consisting essentially of chemical vapor deposition, plasma enhanced chemical vapor deposition, spin coating, atomic layer deposition, drop dispense imprinting, and electron beam patterning.

11. The method as recited in claim 1 wherein said substrate includes a featured region, with forming further including forming said first film upon said featured region.

12. The method as recited in claim 1 wherein forming further includes forming said first film from an organic acrylate material defining a nadir region in superimposition with said nadir surface and further including removing said nadir region, with disposing further including, after removing said nadir region, depositing a dielectric material to form said second film therefrom, with transferring further including removing said organic acrylate material and portions of said dielectric material in superimposition therewith to leave a plurality of spaced-apart regions of said dielectric material on said substrate, defining said recorded pattern.

13. The method as recited in claim 1 wherein forming further includes forming said first film from an organic acrylate material defining a nadir region in superimposition with said nadir surface and further including removing said nadir region, with disposing further including, after removing said nadir region, depositing a conductive material to form said second film therefrom, with transferring further including removing said organic acrylate material and portions of said conductive material in superimposition therewith to leave a plurality of spaced-apart regions of said conductive material on said substrate, defining said recorded pattern.

14. The method as recited in claim 1 wherein forming further includes depositing said first film with a nadir region, in superimposition with said nadir surface, having a thickness associated therewith that is approximately equal to said height.

15. The method as recited in claim 1 wherein forming further includes depositing said first film with a nadir region, in superimposition with said nadir surface, having a thickness associated therewith that is greater than said height.

16. The method as recited in claim 1 wherein forming further includes depositing said first film with a nadir region, in superimposition with said nadir surface, having a thickness associated therewith that is two times greater than said height.

17. The method as recited in claim 1 wherein forming further includes depositing said first film with a nadir region, in superimposition with said nadir surface, having a thickness associated therewith that is ten times greater than said height.

18. A method of patterning a substrate having surface planarity perturbations, said method comprising:
  forming, on said substrate, a first film having an original pattern that includes a plurality of projections a subset of which extends from a nadir surface terminating in an apex surface defining a height therebetween;
  disposing, upon said first film, a second film defining a normalization surface spaced-apart from said apex surface of said plurality of projections, with a variation in a distance between said apex surface of any one of said plurality of projections and said surface being less than ½ said height; and
  transferring onto said substrate, a recorded pattern corresponding to said original pattern by selectively removing portions of said first and second films to expose portions of said substrate in superimposition with said projections while avoiding exposing areas said substrate outside of said portions.

19. The method as recited in claim 18 wherein forming further includes forming said first film to provide said subset of projections with a shoulder disposed between said apex surface and said nadir.

20. The method as recited in claim 18 wherein forming further includes forming said first film with a first substantially free of silicon and depositing further includes providing said second film with a quantity of silicon.

21. The method as recited in claim 18 wherein forming further includes forming said first film using a deposition process selected from a set of deposition processes consisting essentially of chemical vapor deposition, plasma enhanced chemical vapor deposition, spin coating, atomic layer deposition, drop dispense imprinting, and electron beam pattern.

22. The method as recited in claim 21 wherein depositing further includes depositing said second film using a deposition process selected from a set of deposition processes consisting essentially of chemical vapor deposition, plasma enhanced chemical vapor deposition, spin coating, atomic layer deposition, drop dispense imprinting, and electron beam patterning.

23. The method as recited in claim 18 wherein said substrate includes a featured region, with forming further including forming said first film upon said featured region.

24. The method as recited in claim 23 wherein forming further includes depositing said first film with a nadir region, in superimposition with said nadir surface, having a thickness associated therewith that is approximately equal to said height.

25. The method as recited in claim 23 wherein forming further includes depositing said first film with a nadir region, in superimposition with said nadir surface, having a thickness associated therewith that is greater than said height.

26. The method as recited in claim 23 wherein forming further includes depositing said first film with a nadir region, in superimposition with said nadir surface, having a thickness associated therewith that is two times greater than said height.

27. The method as recited in claim 23 wherein forming further includes depositing said first film with a nadir region, in superimposition with said nadir surface, having a thickness associated therewith that is ten times greater than said height.

28. The method as recited in claim 18 wherein forming further includes forming said first film from an organic acrylate material defining a nadir region in superimposition with said nadir surface and further including removing said nadir region, with disposing further including, after removing said nadir region, depositing a dielectric material to form said second film therefrom, with transferring further including removing said organic acrylate material and portions of said dielectric material in superimposition therewith to leave a plurality of spaced-apart regions of said dielectric material on said substrate, defining said recorded pattern.

29. The method as recited in claim 18 wherein forming further includes forming said first film from an organic acrylate material defining a nadir region in superimposition with said nadir surface and further including removing said nadir region, with disposing further including, after removing said nadir region, depositing a conductive material to form said second film therefrom, with transferring further including removing said organic acrylate material and portions of said conductive material in superimposition therewith to leave a plurality of spaced-apart regions of said conductive material on said substrate, defining said recorded pattern.

30. A method of patterning a substrate having surface planarity perturbations, said method comprising:
forming, on a section of said substrate having planarity perturbations, a first film having an original pattern that includes a plurality of projections a subset of which extends from a nadir surface terminating in an apex surface defining a height therebetween, with shoulders being disposed between said apex surface and said nadir surface;
disposing, upon said first film, a second film defining a normalization surface spaced-apart from said apex surface of said plurality of projections, with a variation in a distance between said apex surface of any one of said plurality of projections and said surface being less than ½ said height; and
transferring onto said substrate, a recorded pattern corresponding to said original pattern by selectively removing portions of said first and second films to expose portions of said substrate in superimposition with said projections while avoiding exposing areas said substrate outside of said portions.

31. The method as recited in claim 30 wherein forming further includes depositing said first film with a nadir region, in superimposition with said nadir surface, having a thickness associated therewith that is greater than said height.

32. The method as recited in claim 31 wherein forming further includes forming said first film with a first substantially free of silicon and depositing further includes providing said second film with a quantity of silicon.

33. The method as recited in claim 31 wherein forming further includes forming said first film from an organic acrylate material defining a nadir region in superimposition with said nadir surface and further including removing said nadir region, with disposing further including, after removing said nadir region, depositing a dielectric material to form said second film therefrom, with transferring further including removing said organic acrylate material and portions of said dielectric material in superimposition therewith to leave a plurality of spaced-apart regions of said dielectric material on said substrate, defining said recorded pattern.

34. The method as recited in claim 31 wherein forming further includes forming said first film from an organic acrylate material defining a nadir region in superimposition with said nadir surface and further including removing said nadir region, with disposing further including, after removing said nadir region, depositing a conductive material to form said second film therefrom, with transferring further including removing said organic acrylate material and portions of said conductive material in superimposition therewith to leave a plurality of spaced-apart regions of said conductive material on said substrate, defining said recorded pattern.

35. The method as recited in claim 30 wherein forming further includes depositing said first film with a nadir region, in superimposition with said nadir surface, having a thickness associated therewith that is approximately equal to said height.

* * * * *